United States Patent
Huang

(10) Patent No.: US 9,704,872 B1
(45) Date of Patent: Jul. 11, 2017

(54) MEMORY DEVICE AND FABRICATING METHOD THEREOF

(71) Applicant: Micron Technology, Inc., Boise, ID (US)

(72) Inventor: Pu-Sung Huang, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/990,776

(22) Filed: Jan. 7, 2016

(51) Int. Cl.
| H01L 21/8238 | (2006.01) |
| H01L 21/336 | (2006.01) |
| H01L 29/78 | (2006.01) |
| H01L 27/108 | (2006.01) |
| H01L 23/535 | (2006.01) |
| H01L 29/06 | (2006.01) |
| H01L 21/762 | (2006.01) |
| H01L 21/768 | (2006.01) |

(52) U.S. Cl.
CPC .. H01L 27/10844 (2013.01); H01L 21/76224 (2013.01); H01L 21/76897 (2013.01); H01L 23/535 (2013.01); H01L 27/108 (2013.01); H01L 29/0649 (2013.01)

(58) Field of Classification Search
CPC .............. H01L 27/10844; H01L 27/108; H01L 21/76224; H01L 21/76897; H01L 21/823814; H01L 23/535; H01L 29/0649
USPC ........ 438/199, 299, 787; 257/288, 368, 369, 257/382, 401, E21.632, E21.634, 257/E21.637, E29.193, E29.255

See application file for complete search history.

(56) References Cited

U.S. PATENT DOCUMENTS

| 2004/0076050 | A1 | 4/2004 | Hsieh |
| 2007/0184601 | A1* | 8/2007 | Zhang .............. H01L 21/823814 438/199 |
| 2007/0190730 | A1* | 8/2007 | Huang ............ H01L 21/823807 438/299 |
| 2015/0079740 | A1* | 3/2015 | Kim ..................... H01L 21/8238 438/199 |
| 2015/0262886 | A1* | 9/2015 | Nieh ............... H01L 21/823807 438/221 |

FOREIGN PATENT DOCUMENTS

| CN | 101777495 A | 7/2010 |
| CN | 103681449 A | 3/2014 |
| TW | 423060 B | 2/2001 |
| TW | 200306666 A | 11/2003 |
| TW | 200410360 A | 6/2004 |
| TW | 200841457 A | 10/2008 |
| TW | 201438143 A | 10/2014 |

* cited by examiner

Primary Examiner — Dao H Nguyen
(74) Attorney, Agent, or Firm — TraskBritt

(57) ABSTRACT

A memory device and a method for fabricating the same are provided. The memory device includes a substrate and an isolation structure. The substrate has at least two memory cells, and each of the memory cells includes a first active region, a second active region, and a gate structure. The first active region and the second active region are alternately disposed in the substrate. The gate structure is disposed in the substrate and between the first active region and the second active region. The isolation structure is disposed between and protruding from the second active regions of two adjacent memory cells.

8 Claims, 12 Drawing Sheets

MEMORY DEVICE AND FABRICATING METHOD THEREOF

BACKGROUND

Description of Related Art

A Dynamic Random Access Memory (DRAM) is an essential element in many electronic products. To increase component density and improve overall performance of DRAM, industrial manufacturers make constant efforts to reduce the sizes of transistors for the DRAM. However, as the device size is reduced, the device performance of such DRAM is still not satisfactory in advanced applications of technology.

Accordingly, an improved memory device and a fabricating method thereof are required.

SUMMARY

An aspect of the present disclosure provides a memory device. The memory device includes a substrate and an isolation structure. The substrate has at least two memory cells, and each of the memory cells includes a first active region, a second active region, and a gate structure. The first active region and the second active region are alternately disposed in the substrate. The gate structure is disposed in the substrate and between the first active region and the second active region. The isolation structure is disposed between and protruding from the second active regions of two adjacent memory cells.

In various embodiments of the present disclosure, the gate structure is a multi-layer structure including a first layer and a second layer embedded in the first layer.

In various embodiments of the present disclosure, the isolation structure is higher than the second active region in a range from about 5 nm to about 50 nm.

In various embodiments of the present disclosure, each of the memory cells includes one of the first active region, two of the gate structures, and two of the second active regions. The first active region is disposed between the gate structures, and each of the gate structures is disposed between the first active region and one of the second active regions.

In various embodiments of the present disclosure, the memory device further includes a conductive line electrically connected to the first active region.

In various embodiments of the present disclosure, the memory device further includes an oxide cap surrounding a portion of the isolation structure that is protruding from the second active regions of two adjacent memory cells.

In various embodiments of the present disclosure, the oxide cap is made of silicon dioxide.

In various embodiments of the present disclosure, the memory device further includes a contact structure electrically connected to the second active region.

In various embodiments of the present disclosure, the contact structure is over the second active region, and an interface between the contact structure and the second active region is below the isolation structure.

In various embodiments of the present disclosure, the contact structure is made of polysilicon.

Another aspect of the present disclosure provides a method for fabricating a memory device, and the method includes the following steps. A substrate having at least two memory cells is received, and each of the memory cells includes a first active region, a second active region, and a gate structure. The first active region and the second active region are alternately disposed in the substrate. The gate structure is disposed in the substrate and between the first active region and the second active region. An isolation structure is formed in the substrate and between the second active regions of two adjacent memory cells. The second active regions of the two adjacent memory cells are recessed to expose sidewalls of an upper portion of the isolation structure.

In various embodiments of the present disclosure, forming the gate structure includes the following steps. A first layer is formed. A second layer is formed, which is embedded in the first layer.

In various embodiments of the present disclosure, the upper portion of the isolation structure has a height in a range from about 5 nm to about 50 nm.

In various embodiments of the present disclosure, each of the memory cells comprises one of the first active region, two of the gate structures, and two of the second active regions, the first active region is disposed between the gate structures, and each of the gate structures is disposed between the first active region and one of the second active regions.

In various embodiments of the present disclosure, the method further includes forming a conductive line over the first active region.

In various embodiments of the present disclosure, the method further includes forming an oxide cap surrounding the upper portion of the isolation structure.

In various embodiments of the present disclosure, forming the oxide cap includes the following steps. An oxide layer is deposited over the upper portion of the isolation structure. A portion of the oxide layer is removed to expose a top surface of the isolation structure and to form the oxide cap.

In various embodiments of the present disclosure, the method further includes forming a contact structure over the second active region.

In various embodiments of the present disclosure, forming the contact structure includes the following steps. A contact material layer is deposited over the upper portion of the isolation structure and the second active region. A portion of the contact material layer is removed to expose a top surface of the isolation structure and to form the contact structure.

In various embodiments of the present disclosure, an interface between the contact structure and the second active region is below the isolation structure.

These and other features, aspects, and advantages of the present disclosure will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure may be more fully understood by reading the following detailed description of the embodiments, with reference made to the accompanying drawings as follows.

DETAILED DESCRIPTION

Figure 1A:
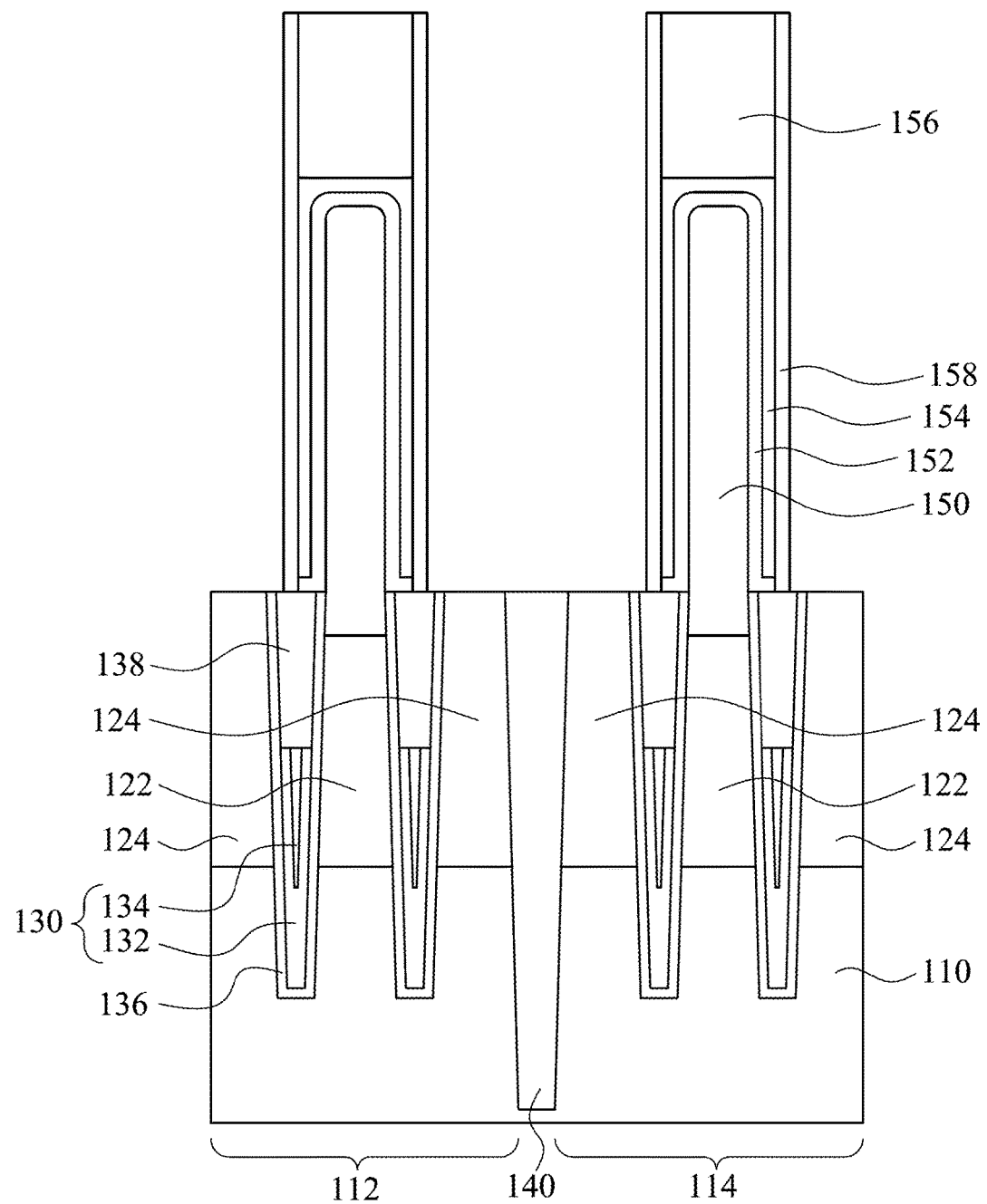
FIGS. 1A through 1E are cross-sectional views at various stages of fabricating a memory device in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As mentioned above, requirements in a memory device are becoming more challenging. For instance, damage usually occurs on an active area (AA) corner during fabrication as the memory device sizes are are decreased, in which the active area may be a source or drain region. Particularly, damage on the corner of the source/drain region, also called as an "AA-clipping," is a source of defect that may provide a leakage path. This kind of defect is inevitable in current fabricating processes while processing cell contact separation. The defect in the active area of the memory device results in retention loss the memory device, which inevitably degrades the performance of the memory device.

The present disclosure provides a memory device and a fabricating method thereof. The memory device of the present disclosure applies an isolation structure higher than a second active region. Therefore, defects caused by AA-clipping can be reduced, and thereby improve the performance of the memory device.

FIGS. 1A through 1E are cross-sectional views at various stages of fabricating a memory device 100 in accordance with various embodiments of the present disclosure.

Referring to FIG. 1A, a substrate 110 having two memory cells 112 and 114 is first received for the fabrication of the memory device 100. Each of the memory cells 112 and 114 includes a first active region 122, second active regions 124, and gate structures 130. The first active region 122 and the second active regions 124 are formed alternately in the substrate 110, and the gate structures 130 are formed in the substrate 110 and between the first active region 122 and the second active regions 124. An isolation structure 140 is formed in the substrate 110, and is disposed between the second active regions 124 of two adjacent memory cells 112 and 114. A conductive line 150 is formed on and electrically connected to the first active region 122.

The substrate 110 may be a silicon substrate, a silicon/germanium (SiGe) substrate, an epi-substrate, a silicon-on-insulator (SOI) substrate, etc.

The first active region 122 and the second active regions 124 may be formed by doping, such as n-doping or p-doping depending on actual requirements. The first active region 122 and the second active regions 124 may respectively function as a source and a drain of the memory device 100, or vice versa. The first active region 122 and the second active regions 124 may be formed before or after the gate structures 130.

The gate structure 130 may be a single-layer structure or a multi-layer structure. For instance, the gate structure 130 includes a first layer 132 and a second layer 134 embedded in the first layer 132 as shown in FIG. 1A. The first layer 132 and the second layer 134 of the gate structure 130 may be independently made of tungsten (W), titanium nitride (TiN), tantalum nitride (TaN), tungsten nitride (WN), ruthenium (Ru), molybdenum nitride (MoN), TaN/TiN, WN/TiN, arsenic (As) doped polycrystalline silicon, tantalum (Ta), aluminum (Al), titanium (Ti), zirconium nitride (ZrN), or a combination thereof. In some embodiments, the first layer 132 is made of titanium nitride, and the second layer 134 is made of tungsten.

It is noteworthy that the gate structures 130 are disposed in the substrate 110, and thus the memory device 100 in the abovementioned embodiments can be called a recess access device (RAD). When a bias is applied to the gate structures 130, a channel may be formed in the substrate 110 and around the gate structures 130. Current may flow between the first active region 122 and the second active regions 124 through the channel.

In some embodiments, the gate structures 130 are formed by forming trenches (not shown) in the substrate 110. Then, the first layers 132 and the second layers 134 of the gate structures 130 are formed by deposition in the bottom portions of the trenches. The unfilled portions of the trenches may be filled with a dielectric material to form dielectric caps 138 over the gate structures 130 as shown in FIG. 1A. The dielectric material of the dielectric cap 138 may be oxide or nitride.

The memory device 100 may apply a dual gate system as shown in FIG. 1A, in which a memory cell 112 or 114 of the memory device 100 includes two gate structures 130, one first active region 122, and two second active regions 124. The isolation structure 140 is disposed between two adjacent memory cells 112 and 114. The first active region 122 is between the gate structures 130, and the second active regions 124 are between the gate structures 130 and the isolation structure 140.

In some embodiments, a gate dielectric layer 136 is formed between the gate structure 130 and the first active region 122 and between the gate structure 130 and the second active region 124. The gate dielectric layer 136 may be formed by deposition before forming the gate structure 130. Examples of the deposition process include, but are not limited to, chemical vapor deposition (CVD), physical vapor deposition (PVD), atomic layer deposition (ALD), and a combination thereof. The material of the gate dielectric layer 136 may be any suitable dielectric material, such as oxide or nitride.

The isolation structure 140 may be shallow trench isolation (STI) structures. The isolation structure 140 is disposed in the substrate 110 and between two adjacent memory cells 112 and 114 to provide electrical isolation. The isolation structures 140 may be fabricated by forming shallow trenches (not shown) in the substrate 110 first and then filling isolation material into the shallow trenches. In some embodiments, the isolation structure 140 is made of dielectric materials, such as silicon oxide, silicon oxynitride, and the like.

The conductive line 150 may be a digit line. In some embodiments, the conductive line 150 includes a stack of polycrystalline silicon and one or more metal layers over the polycrystalline silicon. The material of the one or more metal layers may be tungsten (W), titanium nitride (TiN), tantalum nitride (TaN), tungsten nitride (WN), ruthenium (Ru), molybdenum nitride (MoN), TaN/TiN, WN/TiN, arsenic (As) doped polycrystalline silicon, tantalum (Ta), aluminum (Al), titanium (Ti), zirconium nitride (ZrN), or a combination thereof. A dielectric cap may be optionally formed on the top of the one or more metal layers. The material of the dielectric cap may be oxide or nitride.

In some embodiments, a first dielectric layer 152 and a second dielectric layer 154 are disposed around the conductive line 150 as shown in FIG. 1A. The first dielectric layer 152 and the second dielectric layer 154 may be independently made of oxide, nitride, or a combination thereof. In some embodiments, the first dielectric layer 152 is made of nitride, and the second dielectric layer 154 is made of oxide.

A cover layer 156 may be formed over the second dielectric layer 154, and an insulating layer 158 may be formed on sidewalls of the second dielectric layer 154 and the cover layer 156. In some embodiments, the cover layer 156 is made of oxide, and the insulating layer 158 is made of nitride.

Figure 1B:
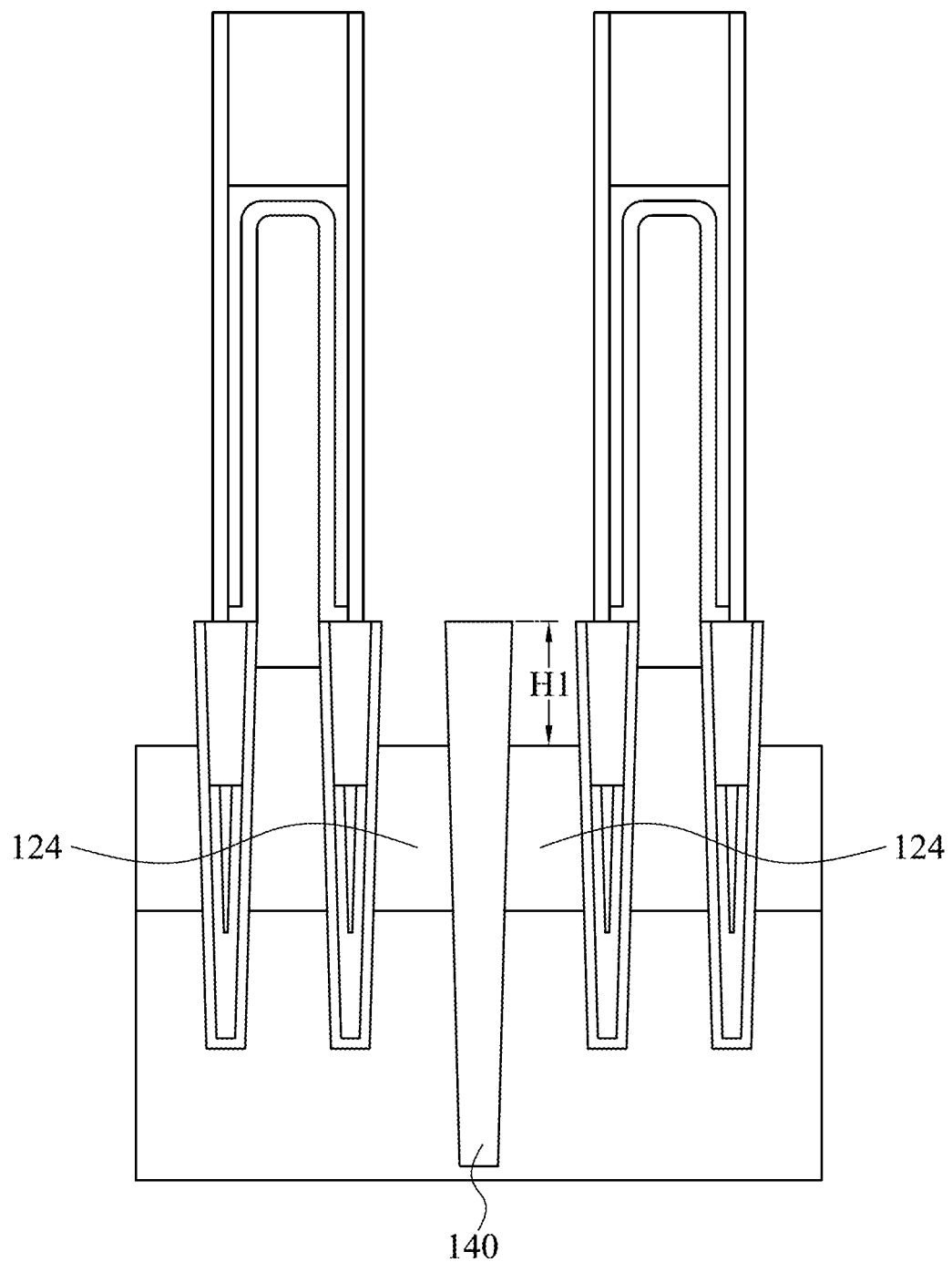

Continuing in FIG. 1B, the second active regions 124 of the two adjacent memory cells 112 and 114 are recessed to expose sidewalls of an upper portion of the isolation structure 140. Accordingly, the isolation structure 140 is protruding from the second active regions 124 of the two adjacent memory cells 112 and 114. That is, the isolation structure 140 is higher than the second active regions 124.

The second active regions 124 may be recessed by a selective etching process, which removes portions of the second active regions 124 to generate a height difference H1 between the second active regions 124 and the isolation structure 140. The selective etching process on the second active regions 124 and the isolation structure 140 leads altitude difference between two different kinds of material, which, for example, the material of the second active regions 124 is silicon, and the material of the isolation structure 140 is silicon dioxide. The height difference H1 is the height of the upper portion of the isolation structure 140. In some embodiments, a top surface of the isolation structure 140 and top surfaces of the second active regions 124 have a height difference H1 in a range from about 5 nm to about 50 nm.

It is noteworthy that the top surface of the isolation structure 140 and the top surfaces of the second active regions 124 are flat, as shown in FIG. 1B. However, the top surface of the isolation structure 140 and the top surfaces of the second active regions 124 may be curved or irregular depending on actual requirements.

Figure 1C:
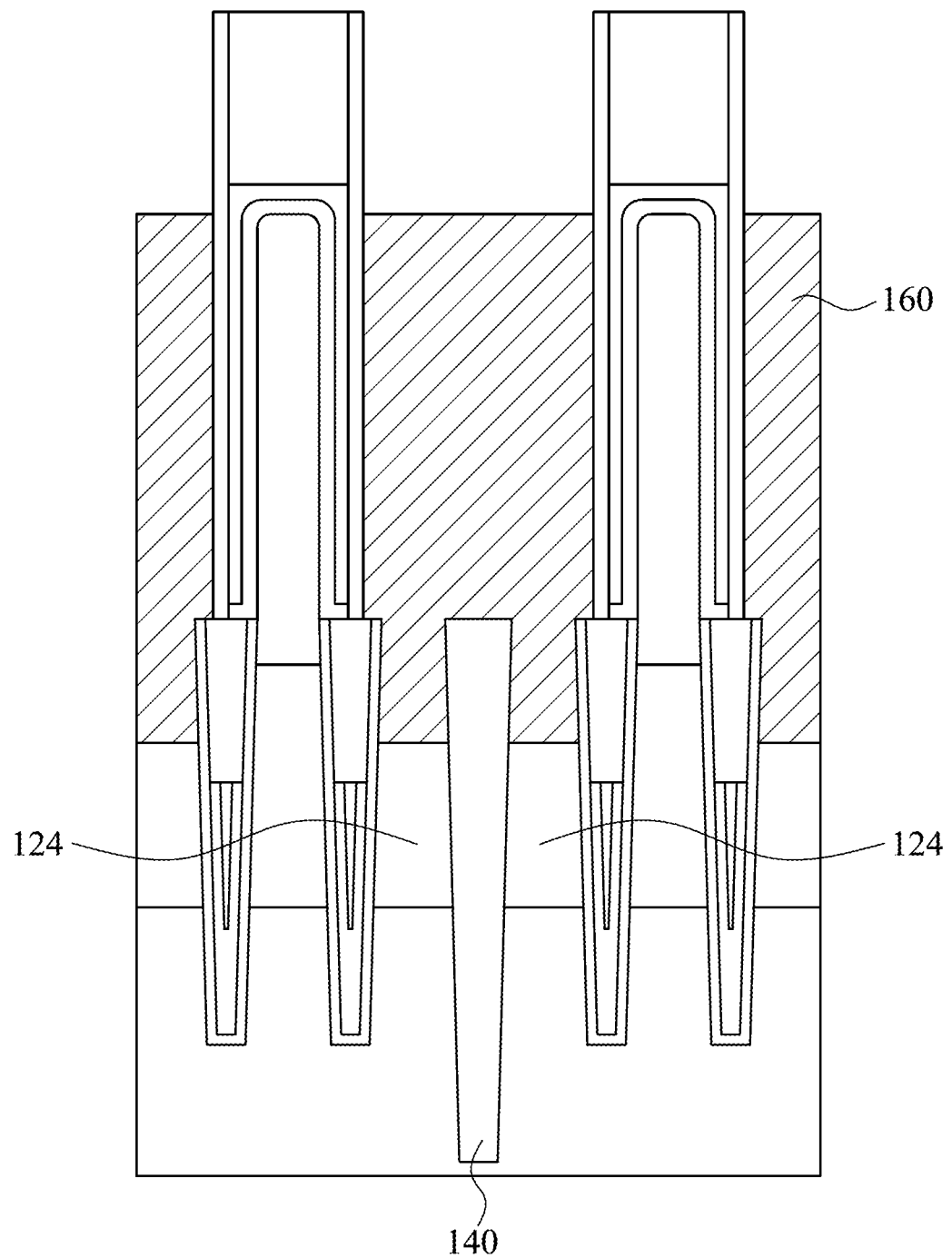
Figure 1D:
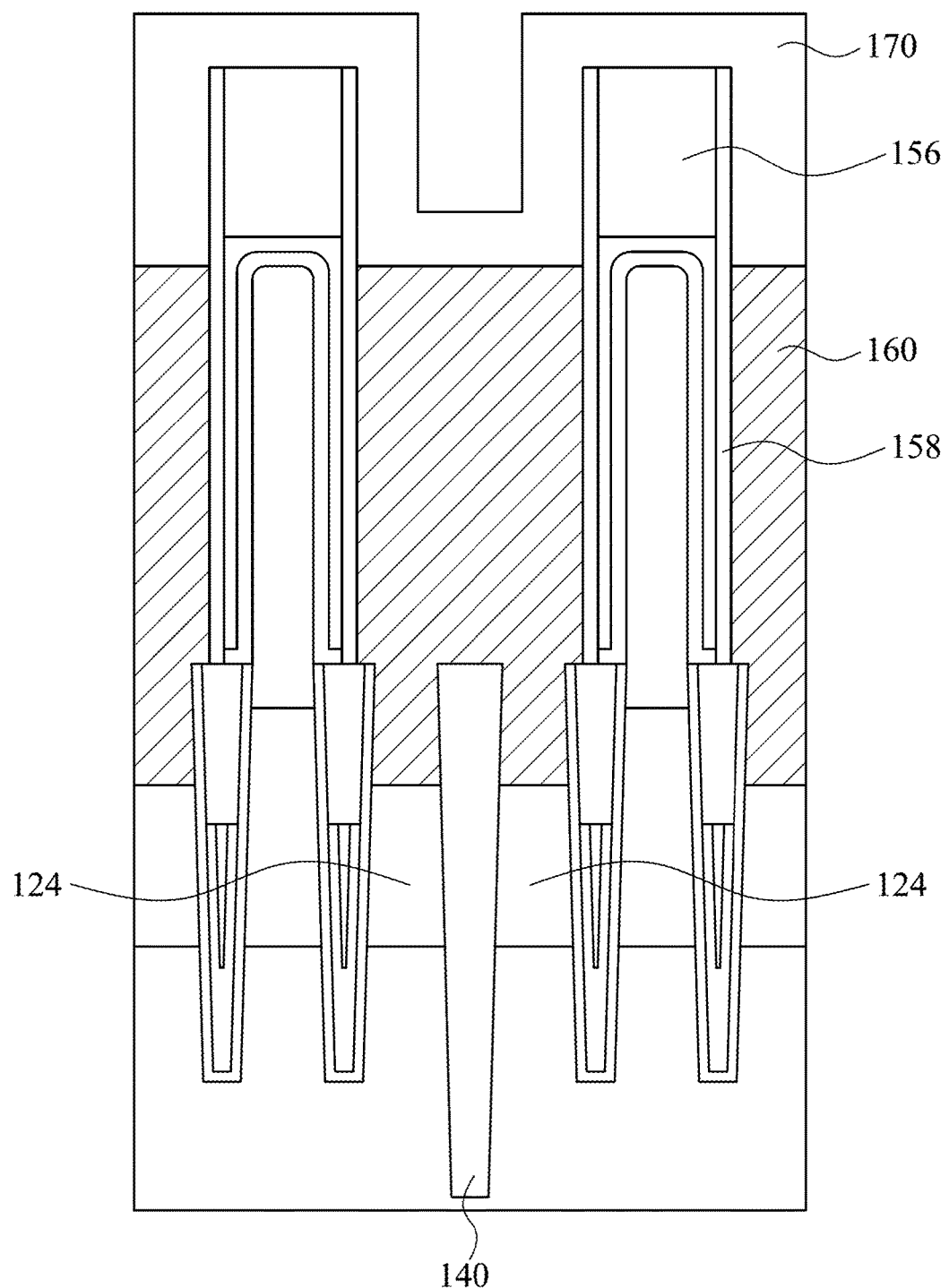
Figure 1E:
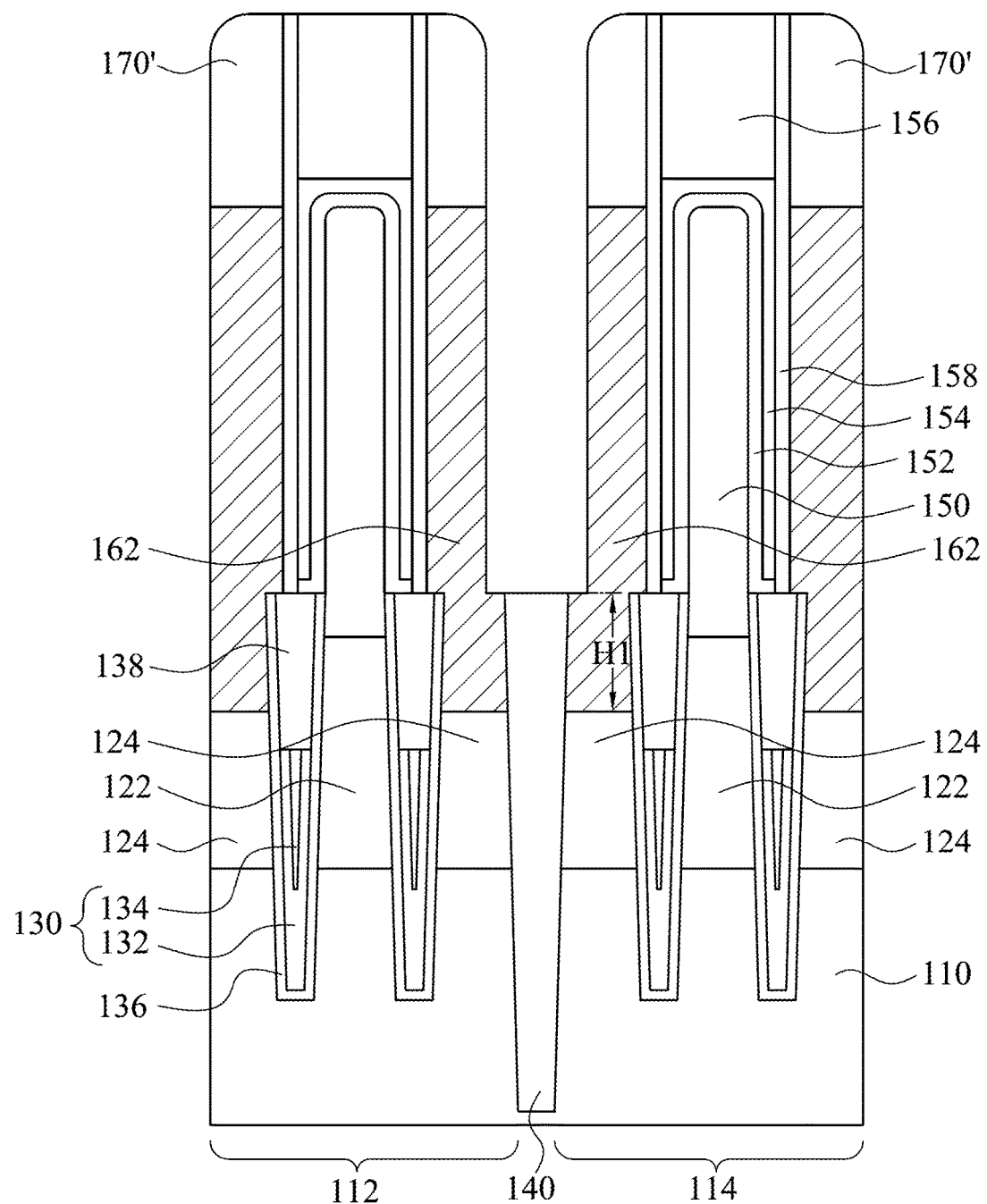

FIGS. 1C through 1E illustrate a process of forming contact structures in accordance with various embodiments of the present disclosure.

Referring to FIG. 1C, a contact material layer 160 is deposited over the upper portion of the isolation structure 140 and the second active regions 124. The contact material layer 160 may be formed by any suitable deposition process, such as those exemplified above. In some embodiments, the contact material layer 160 is made of polysilicon.

Continuing in FIG. 1D, a spacer layer 170 is deposited over the contact material layer 160. In some embodiments, the spacer layer 170 is conformally formed on a top surface of the contact material layer 160, sidewalls of the insulating layer 158, and a top surface of the cover layer 156. The spacer layer 170 may be formed by any suitable deposition process, such as those exemplified above. In some embodiments, the spacer layer 170 is made of nitride.

Referring to FIG. 1E, portions of the contact material layer 160 and the spacer layer 170 are removed to expose the top surface of the isolation structure 140. Accordingly, contact structures 162 are formed over the second active regions 124 of the memory cells 112 and 114, and spacers 170' are formed over the contact structures 162. The portions of the contact material layer 160 and the spacer layer 170 may be removed by an etching process, such as dry etching and wet etching.

It is noteworthy that the top surface of the isolation structure 140 and bottom surfaces of the contact structures 162 are in different levels. Interfaces between the second active regions 124 and the contact structures 162 are below the isolation structure 140. Specifically, the top surface of the isolation structure 140 is higher than the bottom surfaces of the contact structures 162 in altitude, in which the height difference therebetween is the same as the height difference H1 between the second active regions 124 and the isolation structure 140, and may be in a range from about 5 nm to about 50 nm. In some embodiments, the bottom surfaces of the contact structures 162 are interfaces between the contact structures 162 and the second active regions 124.

The formed memory device 100 in accordance with various embodiments of the present disclosure includes the substrate 110 and the isolation structure 140. The substrate 110 includes the memory cells 112 and 114, and each of the memory cells 112 or 114 includes the first active region 122, the second active regions 124, the gate structures 130, the gate dielectric layer 136, the dielectric cap 138, the conductive line 150, the first dielectric layer 152, the second dielectric layer 154, the cover layer 156, the insulating layer 158, the contact structures 162, and the spacers 170'. The first active region 122 and the second active regions 124 are alternately disposed in the substrate 110. The gate structures 130 are disposed in the substrate 110 and between the first active region 122 and the second active regions 124. Each of the gate structures 130 includes the first layer 132 and the second layer 134 embedded in the first layer 132. The conductive line 150 is disposed on and electrically connected to the first active region 122. The first dielectric layer 152 and the second dielectric layer 154 are disposed around the conductive line 150. The cover layer 156 is over the second dielectric layer 154, and the insulating layer 158 is on the sidewalls of the second dielectric layer 154 and the cover layer 156. The contact structures 162 are disposed over and electrically connected to the second active regions 124 of the memory cell 112 or 114, and the spacers 170' are disposed over the contact structures 162. The isolation structure 140 is disposed in the substrate 110, and is between the two adjacent memory cells 112 and 114. Particularly, the isolation structure 140 is disposed between and protruding from the second active regions 124 of the two memory cells 112 and 114.

The method for fabricating the memory device of the present disclosure applies an additional recessing step of the second active region before forming the contact structure. As a result, the isolation structure is higher than the second active region, and an interface between the second active region and the contact structure is below the isolation structure. Further, after the deposition of the contact material layer, the interfaces between the contact material layer and the second active regions are lower than the top surface of the isolation structure. A higher isolation structure may lead to less over-etching processes while separating the contact material layer to form the contact structures. The method for fabricating the memory device of the present disclosure separates the contact material layer easily without hurting the corner of the active regions, also called active area (AA) corner. Hence, defects caused by AA-clipping damage on the corner of the active regions can be reduced, which makes it less likely to generate a leakage path. By additional recessing process before the deposition of the contact material layer, retention of the memory device can be dramatically improved with very small cost on the recessing process, such as a selective etching process. Accordingly, the performance of the memory device is improved.

FIGS. 2A through 2G are cross-sectional views at various stages of fabricating a memory device 200 in accordance with various embodiments of the present disclosure.

Figure 2A:
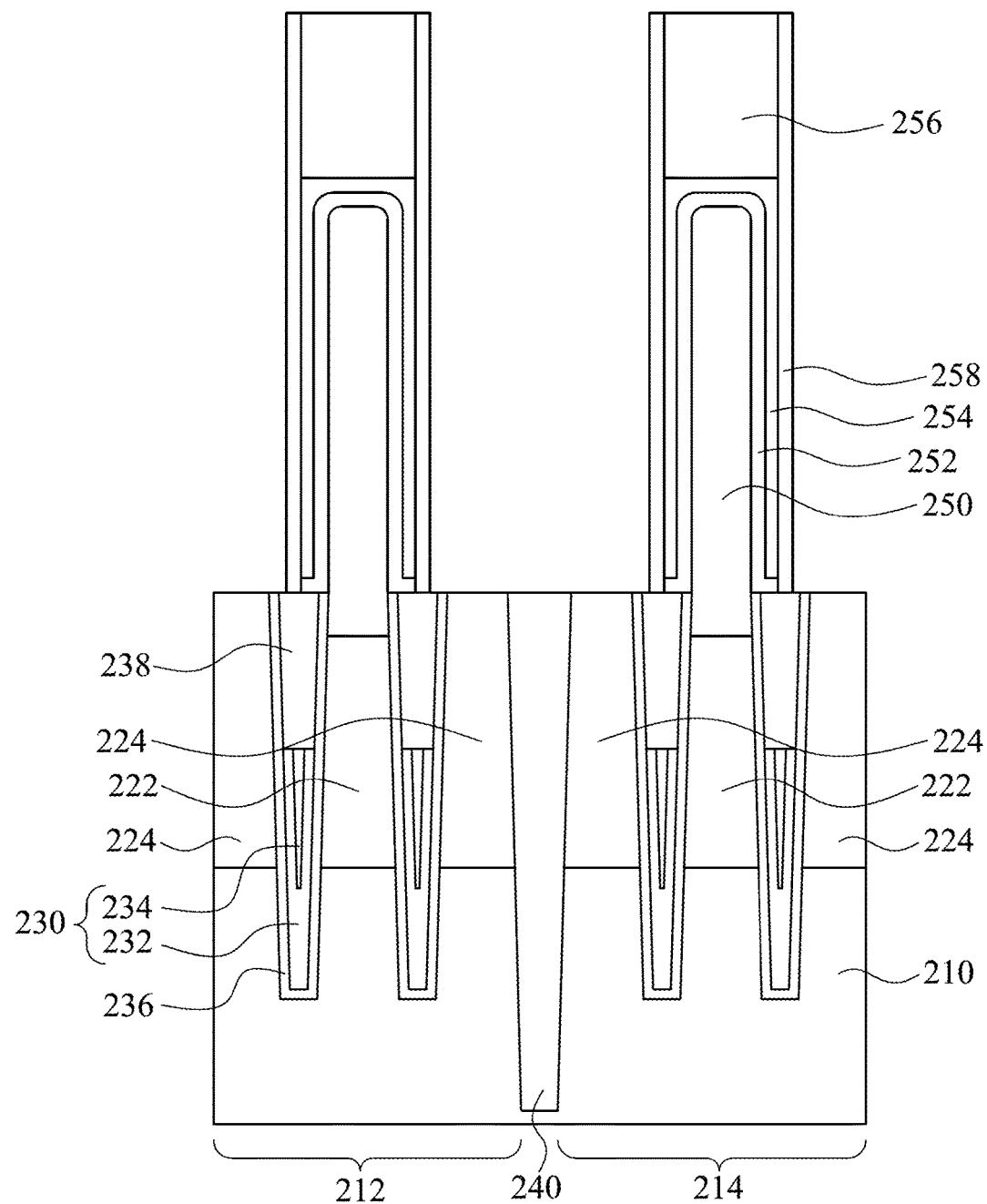
FIGS. 2A through 2G are cross-sectional views at various stages of fabricating a memory device in accordance with various embodiments of the present disclosure.

Referring to FIG. 2A, a substrate 210 having two memory cells 212 and 214 is first received for the fabrication of the memory device 200. Each of the memory cells 212 and 214 includes a first active region 222, second active regions 224, and gate structures 230. The first active region 222 and the second active regions 224 are formed alternately in the substrate 210, and the gate structures 230 are formed in the substrate 210 and between the first active region 222 and the second active regions 224. An isolation structure 240 is formed in the substrate 210, and is disposed between the second active regions 224 of two adjacent memory cells 212 and 214. A conductive line 250 is formed on and electrically connected to the first active region 222.

The first active region 222 and the second active region 224 may respectively function as a source and a drain of the memory device, or vice versa, and may be n-doped or p-doped, depending on actual requirements.

The gate structure 230 may be a single-layer structure or a multi-layer structure. As shown in FIG. 2A, the gate structure 230 includes a first layer 232 and a second layer 234 embedded in the first layer 232. Examples of the materials of the first layer 232 and the second layer 234 may be referred to those exemplified for the first layer 132 and the second layer 134 of FIG. 1A. In some embodiments, the first layer 232 is made of titanium nitride, and the second layer 234 is made of tungsten.

In some embodiments, the gate structures 230 are formed by forming trenches (not shown) in the substrate 210. Then, the first layers 232 and the second layers 234 of the gate structures 230 are formed by deposition in the bottom portions of the trenches. The unfilled portions of the trenches may be filled with a dielectric material to form dielectric caps 238 over the gate structures 230 as shown in FIG. 2A. In some embodiments, a gate dielectric layer 236 is formed between the gate structure 230 and the first active region 222 and between the gate structure 230 and the second active regions 224. The gate dielectric layer 236 may be made of any suitable dielectric material, such as oxide or nitride.

The isolation structure 240 may be shallow trench isolation (STI) structures. The isolation structure 240 is disposed in the substrate 210 and between two adjacent memory cells 212 and 214 to provide electrical isolation.

The conductive line 250 may be a digit line. In some embodiments, the conductive line 250 includes a stack of polycrystalline silicon and one or more metal layers over the polycrystalline silicon. A dielectric cap may be optionally formed on the top of the one or more metal layers. The material of the dielectric cap may be oxide or nitride.

In some embodiments, a first dielectric layer 252 and a second dielectric layer 254 are disposed around the conductive line 250 as shown in FIG. 2A. Examples of the materials of the first dielectric layer 252 and the second dielectric layer 254 may be referred to those exemplified for the first dielectric layer 152 and the second dielectric layer 154 of FIG. 1A. In some embodiments, the first dielectric layer 252 is made of nitride, and the second dielectric layer 254 is made of oxide.

A cover layer 256 may be formed over the second dielectric layer 254, and an insulating layer 258 may be formed on sidewalls of the second dielectric layer 254 and the cover layer 256. In some embodiments, the cover layer 256 is made of oxide, and the insulating layer 258 is made of nitride.

Other features such as materials, forming manners, and functions of each components may be referred to those exemplified for the counterparts of FIG. 1A.

Figure 2B:
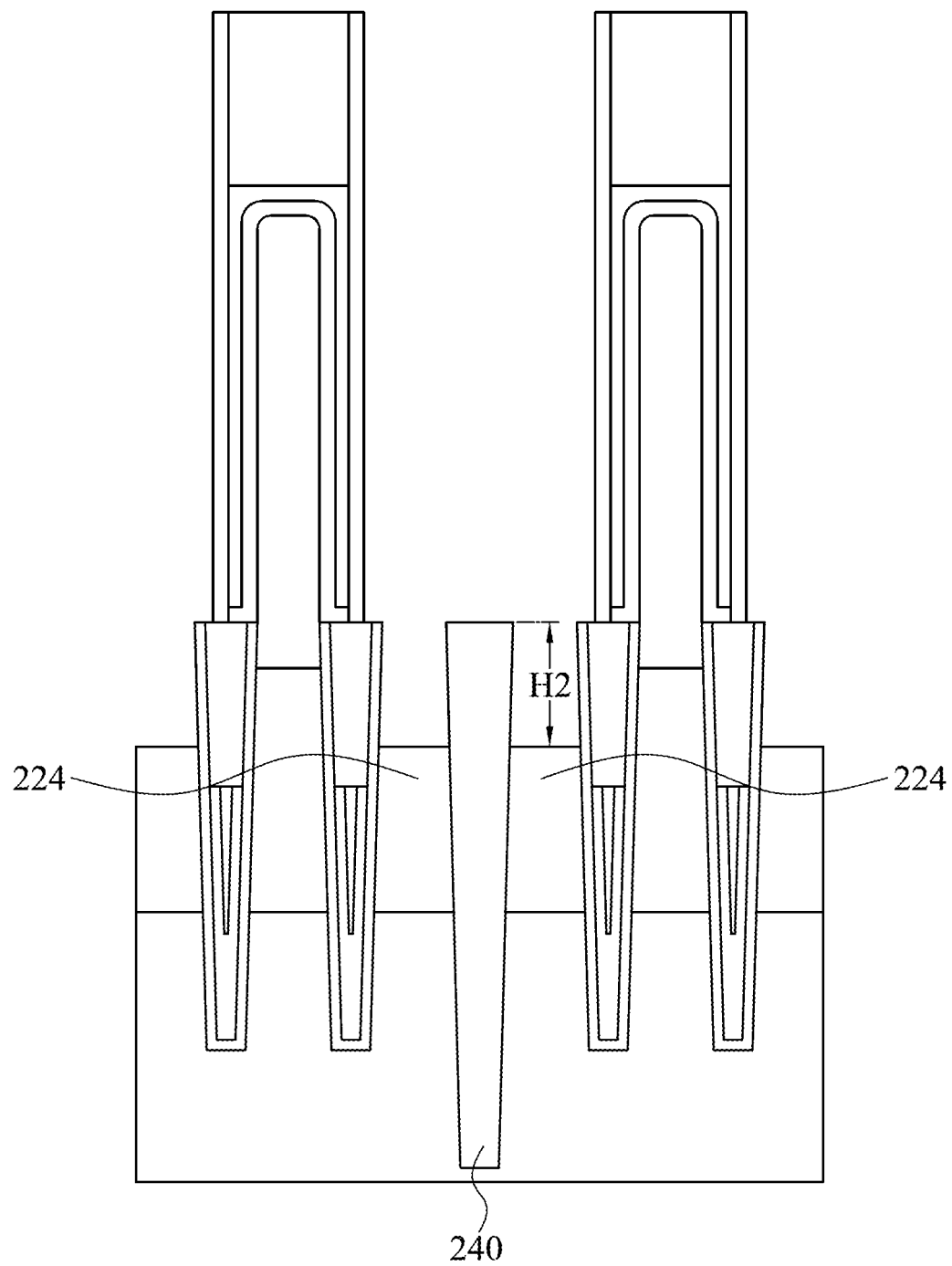

Continuing in FIG. 2B, the second active regions 224 of the two adjacent memory cells 212 and 214 are recessed to expose sidewalls of an upper portion of the isolation structure 240. Accordingly, the isolation structure 240 is protruding from the second active regions 224 of the two adjacent memory cells 212 and 214. That is, the isolation structure 240 is higher than the second active regions 224.

The second active regions 224 may be recessed by a selective etching process, which removes portions of the second active regions 224 to generate a height difference H2 between the second active regions 224 and the isolation structure 240. The height difference H2 is the height of the upper portion of the isolation structure 240. In some embodiments, a top surface of the isolation structure 240 and top surfaces of the second active regions 224 have a height difference H2 in a range from about 5 nm to about 50 nm.

It is noteworthy that the top surface of the isolation structure 240 and the top surfaces of the second active regions 224 are flat, as shown in FIG. 2B. However, the top surface of the isolation structure 240 and the top surfaces of the second active regions 224 may be curved or irregular depending on actual requirements.

Figure 2C:
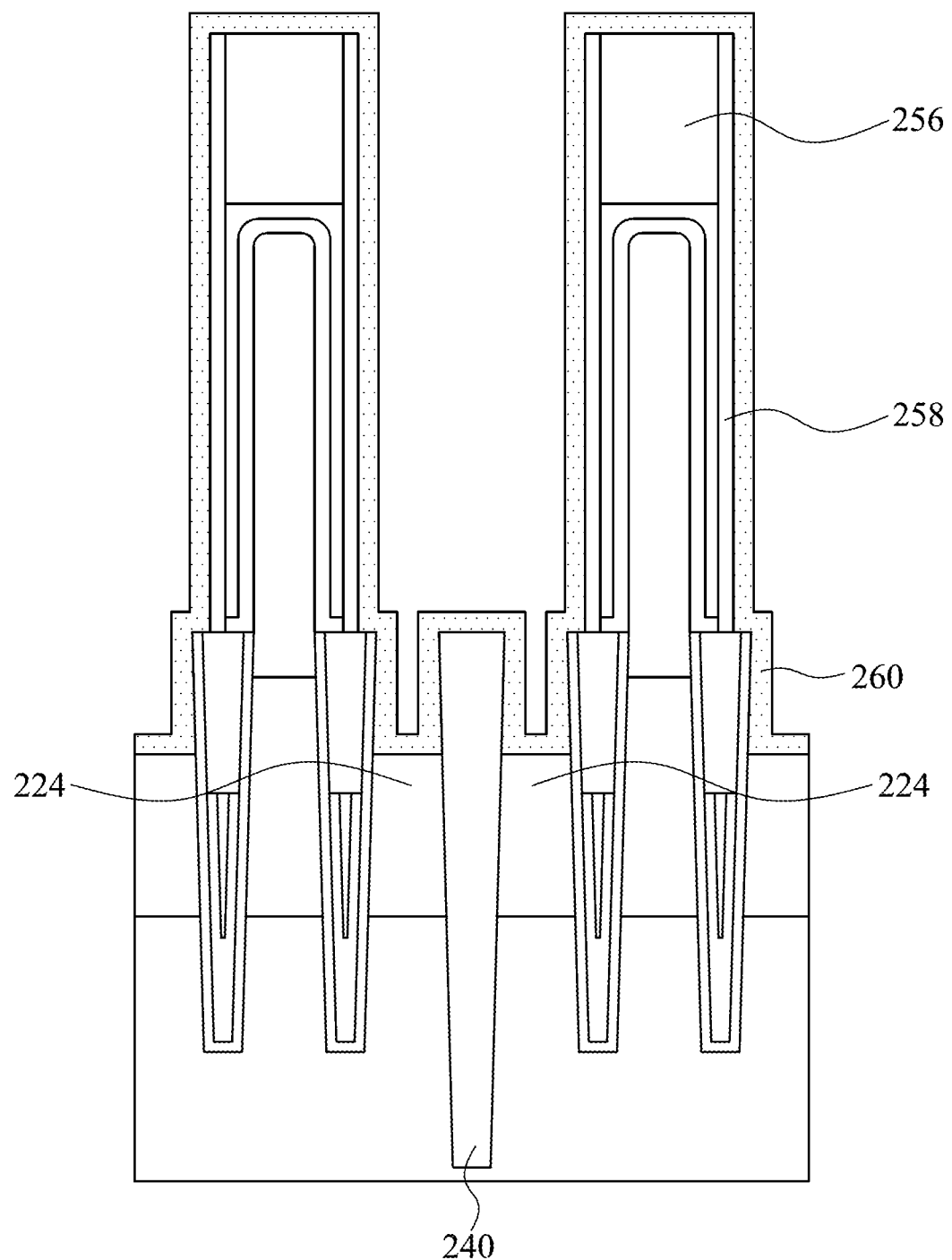

Referring to FIG. 2C, an oxide layer 260 is deposited over the upper portion of the isolation structure 240. The oxide layer 260 may be conformally formed on top surfaces of the second active regions 224, sidewalls of the insulating layer 258, and a top surface of the cover layer 256. The oxide layer 260 may be deposited by any deposition process exemplified above. The material of the oxide layer 260 may be the same as the material of the isolation structure 240. In some embodiments, the oxide layer 260 is made of silicon oxide.

Figure 2D:
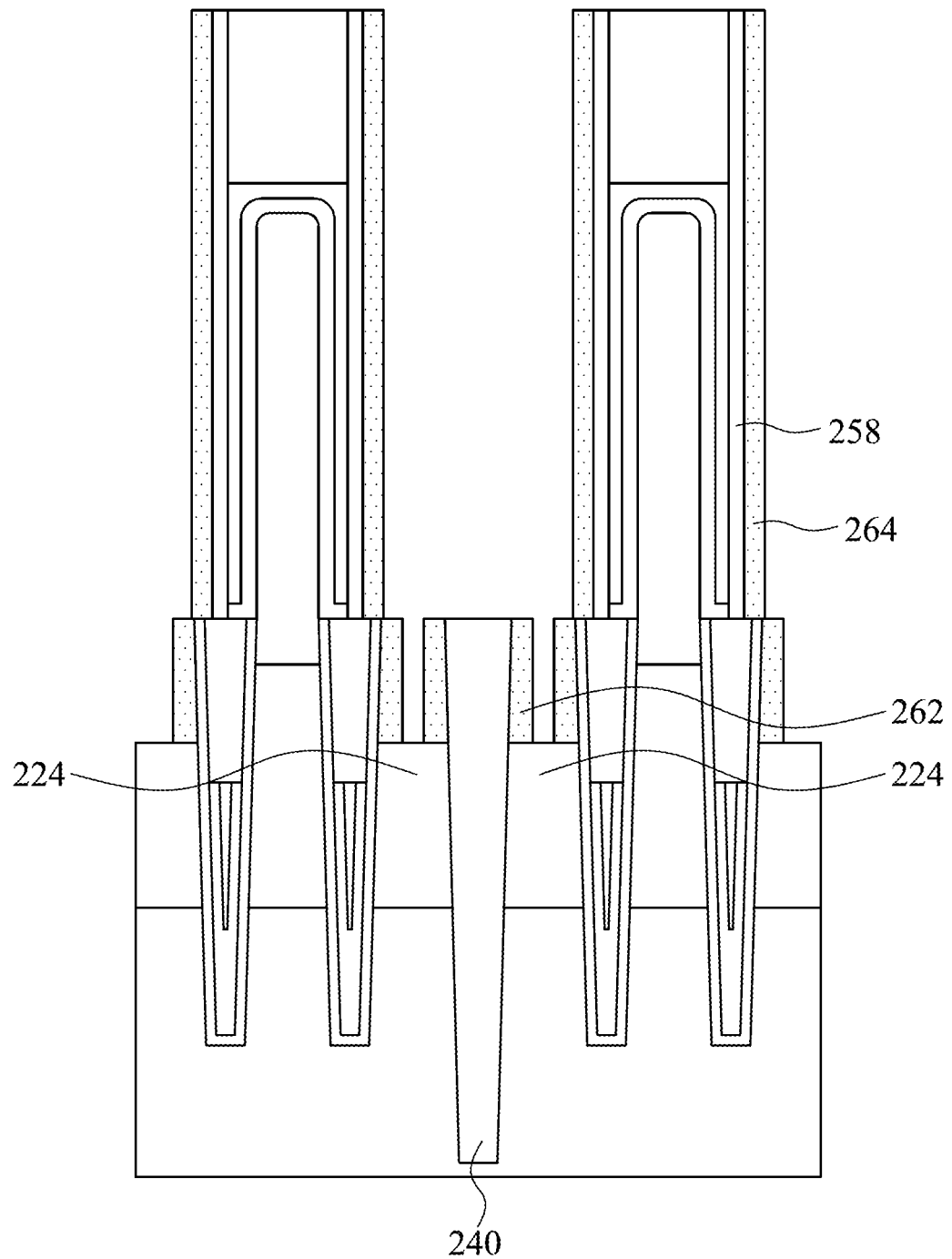

Continuing in FIG. 2D, a portion of the oxide layer 260 is removed to expose the top surface of the isolation structure 240 and to form an oxide cap 262, and to leave oxide walls 264 on the sidewalls of the insulating layer 258. The formed oxide cap 262 surrounds the upper portion of the isolation structure 240. The portion of the oxide layer 260 may be removed by any suitable process, such as dry etching.

Figure 2E:
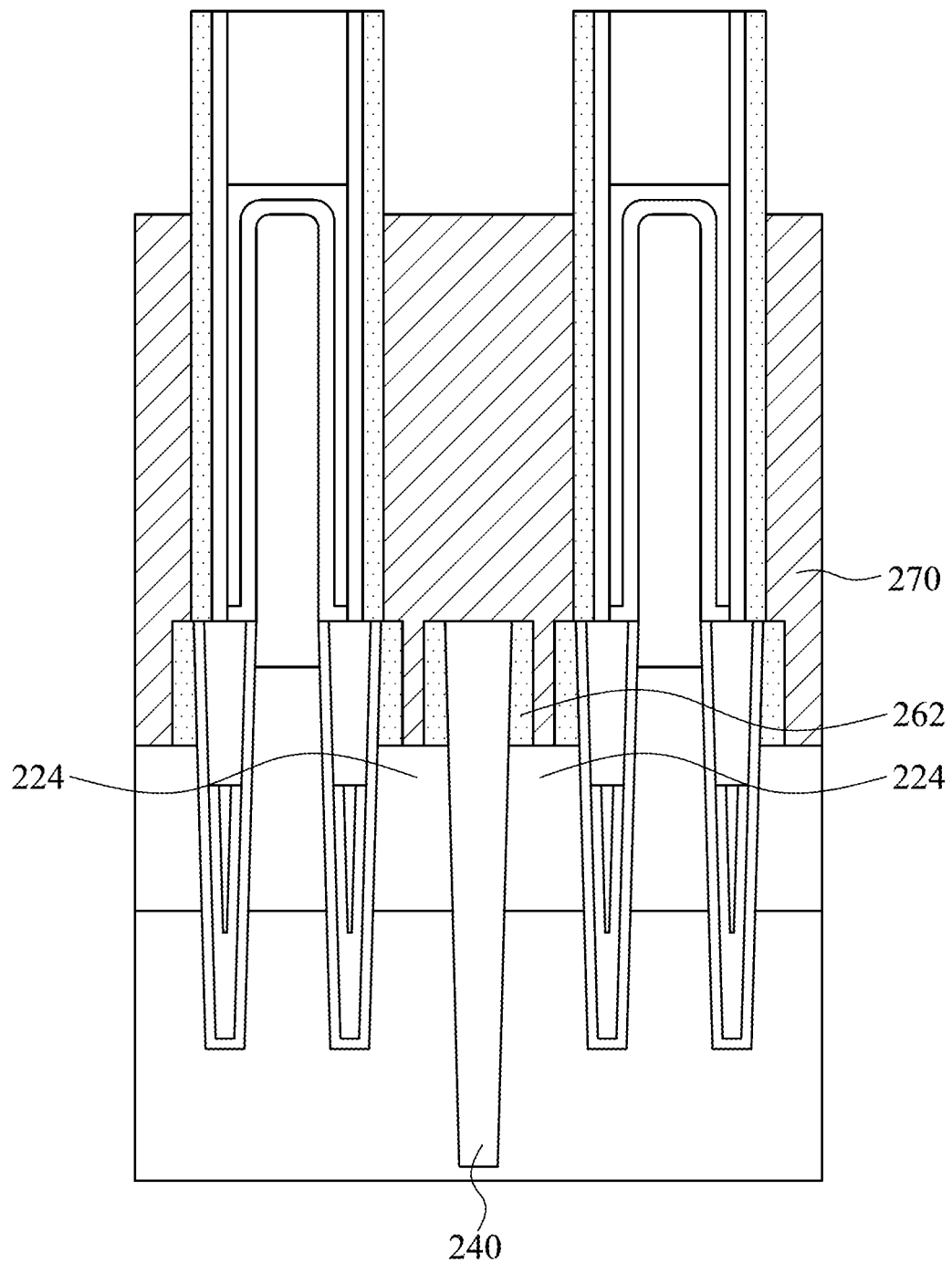
Figure 2F:
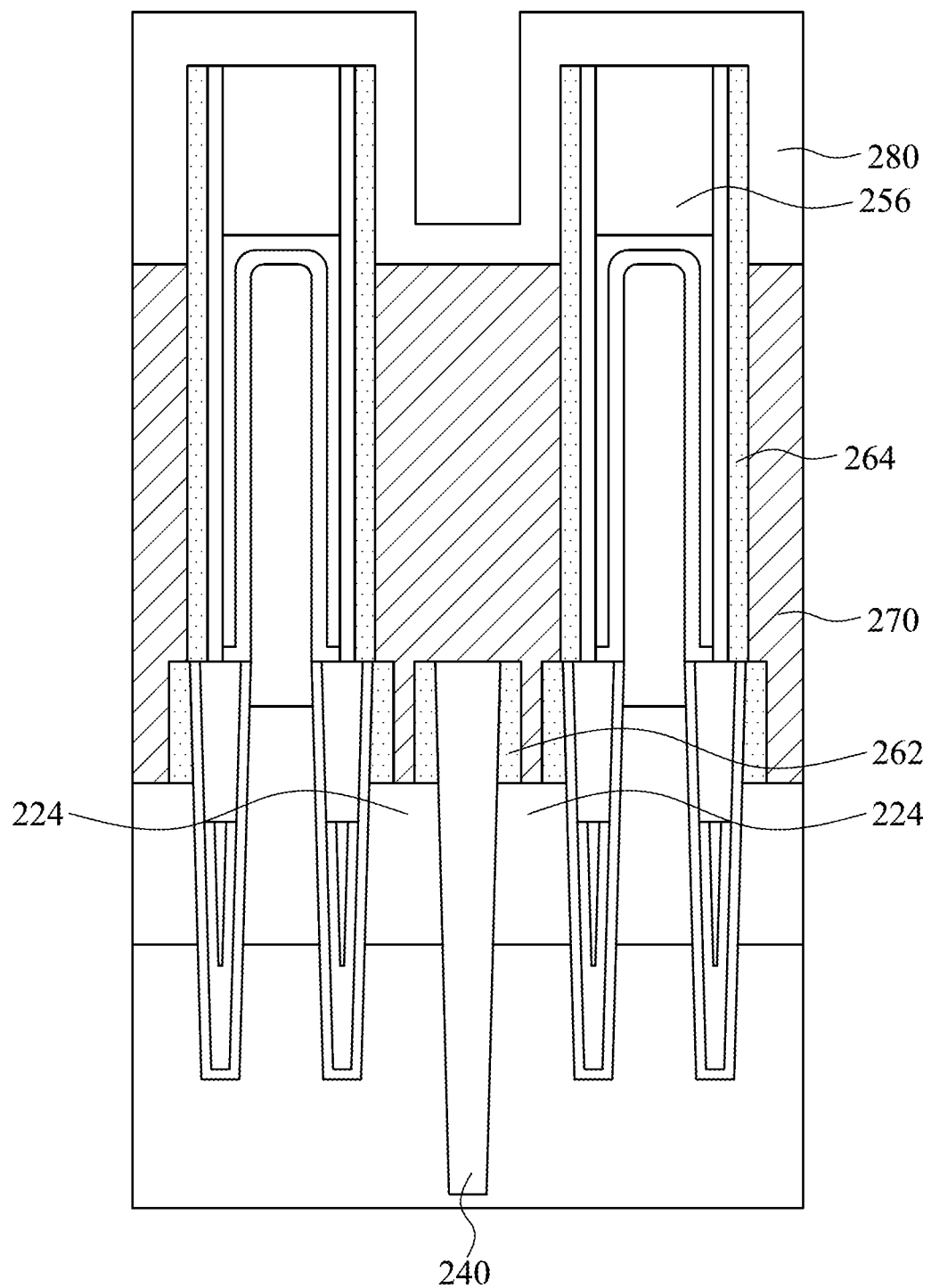
Figure 2G:
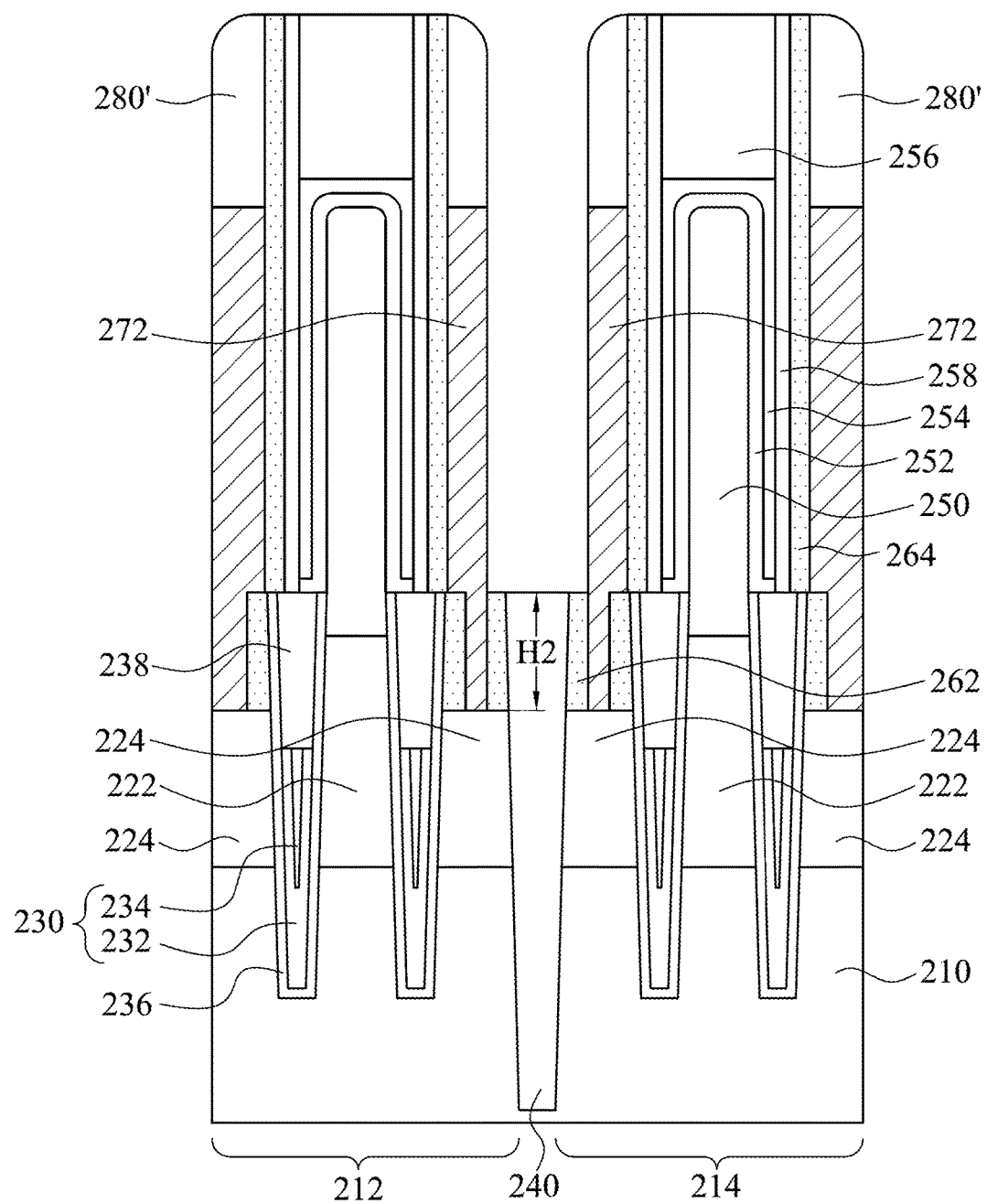

The oxide cap 262, formed by a process shown in FIGS. 2C through 2D, increases lateral thickness and enlarges a landing area on the top of the isolation structure 240 in the subsequent process for forming contact structures, in which the enlarged top of the isolation structure 240, surrounded by the oxide cap 262, reduces the probability of over etching of the AA corner and even the lateral or bottom side of the contact structures 272 (FIG. 2G). Hence, the AA-clipping damage on the corner of the active regions is reduced to achieve better data retention of the memory device 200.

FIGS. 2E through 2G illustrate a process of forming contact structures in accordance with various embodiments of the present disclosure.

Referring to FIG. 2E, a contact material layer 270 is deposited over the upper portion of the isolation structure 240 and the second active regions 224. The contact material layer 270 may be formed by any suitable deposition process, such as those exemplified above. In some embodiments, the contact material layer 270 is made of polysilicon.

Continuing in FIG. 2F, a spacer layer 280 is deposited over the contact material layer 270. In some embodiments, the spacer layer 280 is conformally formed on a top surface of the contact material layer 270, sidewalls of the oxide walls 264, and the top surface of the cover layer 256. The spacer layer 280 may be formed by any suitable deposition process, such as those exemplified above. In some embodiments, the spacer layer 280 is made of nitride, such as silicon nitride (SiN).

Referring to FIG. 2G, portions of the contact material layer 270 and the spacer layer 280 are removed to expose the top surface of the isolation structure 240. Accordingly, contact structures 272 are formed over the second active regions 224 of the memory cells 212 and 214, and spacers 280' are formed over the contact structures 272. The portions of the contact material layer 270 and the spacer layer 280 may be removed by an etching process, such as dry etching and wet etching.

The top surface of the isolation structure 240 and bottom surfaces of the contact structures 272 are in different levels. Interfaces between the second active regions 224 and the contact structures 272 are below the isolation structure 240. Specifically, the top surface of the isolation structure 240 is higher than the bottom surfaces of the contact structures 272 in altitude, in which the height difference therebetween is the same as the height difference H2 between the second active regions 224 and the isolation structure 240, and may be in a range from about 5 nm to about 50 nm. In some embodiments, the bottom surfaces of the contact structures 272 are interfaces between the contact structures 272 and the second active regions 224.

The formed memory device 200 in accordance with various embodiments of the present disclosure includes the substrate 210, the isolation structure 240, and the oxide cap 262. The substrate 210 includes the memory cells 212 and 214, and each of the memory cells 212 or 214 includes the first active region 222, the second active regions 224, the gate structures 230, the gate dielectric layer 236, the dielectric cap 238, the conductive line 250, the first dielectric layer 252, the second dielectric layer 254, the cover layer 256, the insulating layer 258, the contact structures 272, and the spacers 280'. The first active region 222 and the second active regions 224 are alternately disposed in the substrate 210. The gate structures 230 are disposed in the substrate 210 and between the first active region 222 and the second active regions 224. Each of the gate structures 230 includes the first layer 232 and the second layer 234 embedded in the first layer 232. The conductive line 250 is disposed on and electrically connected to the first active region 222. The first dielectric layer 252 and the second dielectric layer 254 are disposed around the conductive line 250. The cover layer 256 is over the second dielectric layer 254, and the insulating layer 258 is on the sidewalls of the second dielectric layer 254 and the cover layer 256. The contact structures 272 are disposed over and electrically connected to the second active regions 224 of the memory cell 212 or 214, and the spacers 280' are disposed over the contact structures 272. The isolation structure 240 is disposed in the substrate 210, and is between the two adjacent memory cells 212 and 214. Particularly, the isolation structure 240 is disposed between and protruding from the second active regions 224 of the two memory cells 212 and 214. The oxide cap 262 surrounds the upper portion of the isolation structure 240.

The difference between the embodiments shown in FIGS. 2A through 2G and FIGS. 1A through 1E is that the memory device 200 further includes the oxide cap 262 surrounding the portion of the isolation structure 240 that is protruding from the second active regions 224 of the two adjacent memory cells 212 and 214. This difference does not affect the functions of other components and steps in the embodiments. Therefore, the memory device 200 and the fabricating method thereof have the same functions and advantages as the memory device 100 shown in FIGS. 1A through 1E.

Further, besides easily separating the contact material layer without hurting the AA corner, the method for fabricating the memory device shown in FIGS. 2A through 2G has a higher tolerance of contact material layer mis-landing due to the enlarged top of the isolation structure 240.

The embodiments of the present disclosure discussed above have advantages over existing memory devices and processes, and the advantages are summarized below. The method for fabricating the memory device of the present disclosure applies an additional recessing step of the second active region before forming the contact structure. As a result, the isolation structure of the formed memory device is higher than the second active region, and an interface between the second active region and the contact structure is below the isolation structure. Hence, problems such as AA-clipping are reduced. Moreover, the oxide cap surrounding the isolation structure is formed by additional deposition and etching processes to enlarge the etching window for forming the contact structures, and the problems of AA-clipping are thereby further reduced. Accordingly, the retention performance of the memory device is improved.

It is noteworthy that the foregoing operating sequences for the method of fabricating the memory device are merely examples and are not intended to be limiting, and various changes, substitutions, and alterations may be made without departing from the spirit and scope of the present disclosure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method for fabricating a memory device, the method comprising:
   receiving a substrate having at least two memory cells, each of the memory cells comprising:
      a first source/drain region and a second source/drain region alternately disposed in the substrate; and
      a gate structure disposed in the substrate and laterally between the first source/drain region and the second source/drain region;
   forming an isolation structure in the substrate and between the second source/drain regions of two adjacent memory cells;
   removing an upper portion of each of the second source/drain regions of the two adjacent memory cells to expose sidewalls of an upper portion of the isolation structure; and
   forming a contact structure over the second source/drain region after removing the upper portion of each of the second source/drain regions of the two adjacent memory cells, wherein an interface between the contact structure and the second source/drain region is below the isolation structure.

2. The method of claim 1, wherein forming the gate structure comprises:
   forming a trench in the substrate;
   forming a first layer in the trench; and
   forming a second layer over the first layer and in the trench.

3. The method of claim 1, wherein the upper portion of the isolation structure has a height in a range from about 5 nm to about 50 nm.

4. The method of claim 1, wherein each of the memory cells comprises one of the first source/drain region, two of the gate structures, and two of the second source/drain regions, and the first source/drain region is disposed between the gate structures, and each of the gate structures is disposed between the first source/drain region and one of the second source/drain regions.

5. The method of claim 1, further comprising forming a conductive line over the first source/drain region.

6. The method of claim 1, further comprising forming an oxide cap surrounding the upper portion of the isolation structure.

7. The method of claim 6, wherein forming the oxide cap comprises:
- depositing an oxide layer over the upper portion of the isolation structure; and
- removing a portion of the oxide layer to expose a top surface of the isolation structure and to form the oxide cap.

8. The method of claim 1, wherein forming the contact structure comprises:
- depositing a contact material layer over the upper portion of the isolation structure and the second source/drain region; and
- removing a portion of the contact material layer to expose a top surface of the isolation structure and to form the contact structure.

* * * * *

UNITED STATES PATENT AND TRADEMARK OFFICE
CERTIFICATE OF CORRECTION

PATENT NO.       : 9,704,872 B1
APPLICATION NO.  : 14/990776
DATED            : July 11, 2017
INVENTOR(S)      : Pu-Sung Huang et al.

Page 1 of 1

It is certified that error appears in the above-identified patent and that said Letters Patent is hereby corrected as shown below:

In the Specification

| | | |
|---|---|---|
| Column 1, | Line 19, | change title "SUMMARY" to --BRIEF SUMMARY-- |
| Column 3, | Line 21, | change "sizes are are decreased" to --sizes are decreased-- |
| Column 3, | Line 24, | change "as an "AA-clipping,"" to --"an AA-clipping,"-- |
| Column 3, | Line 28, | change "loss the" to --loss in the-- |

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*